(12) United States Patent
Weber et al.

(10) Patent No.: US 10,411,090 B2
(45) Date of Patent: Sep. 10, 2019

(54) HYBRID TRIGATE AND NANOWIRE CMOS DEVICE ARCHITECTURE

(71) Applicant: Intel Corporation, Santa Clara, CA (US)

(72) Inventors: Cory E. Weber, Hillsboro, OR (US); Rishabh Mehandru, Portland, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/745,417

(22) PCT Filed: Sep. 24, 2015

(86) PCT No.: PCT/US2015/051979
§ 371 (c)(1),
(2) Date: Jan. 16, 2018

(87) PCT Pub. No.: WO2017/052554
PCT Pub. Date: Mar. 30, 2017

(65) Prior Publication Data
US 2018/0212023 A1    Jul. 26, 2018

(51) Int. Cl.
*H01L 29/06*    (2006.01)
*H01L 21/8238*    (2006.01)
(Continued)

(52) U.S. Cl.
CPC .... *H01L 29/0673* (2013.01); *H01L 21/02236* (2013.01); *H01L 21/30604* (2013.01);
(Continued)

(58) Field of Classification Search
CPC .......... H01L 29/0673; H01L 21/02236; H01L 21/30604; H01L 21/324; H01L 21/823807;
(Continued)

(56) References Cited

U.S. PATENT DOCUMENTS

2009/0289304 A1    11/2009    Pouydebasque et al.
2011/0227165 A1    9/2011    Basker et al.
(Continued)

OTHER PUBLICATIONS

International Search Report and Written Opinion for International Patent Application No. PCT/US2015/051979 dated Jun. 13, 2016, 13 pgs.
(Continued)

*Primary Examiner* — Fernando L Toledo
*Assistant Examiner* — Neil R Prasad
(74) *Attorney, Agent, or Firm* — Schwabe, Williamson & Wyatt, P.C.

(57) ABSTRACT

Hybrid trigate and nanowire CMOS device architecture, and methods of fabricating hybrid trigate and nanowire CMOS device architecture, are described. For example, a semiconductor structure includes a semiconductor device of a first conductivity type having a plurality of vertically stacked nanowires disposed above a substrate. The semiconductor structure also includes a semiconductor device of a second conductivity type opposite the first conductivity type, the second semiconductor device having a semiconductor fin disposed above the substrate.

13 Claims, 13 Drawing Sheets

(51) Int. Cl.
*H01L 27/092* (2006.01)
*H01L 21/02* (2006.01)
*H01L 21/306* (2006.01)
*H01L 21/324* (2006.01)
*H01L 29/08* (2006.01)
*H01L 29/10* (2006.01)
*H01L 29/161* (2006.01)
*H01L 29/66* (2006.01)

(52) U.S. Cl.
CPC .... *H01L 21/324* (2013.01); *H01L 21/823807* (2013.01); *H01L 21/823821* (2013.01); *H01L 21/823828* (2013.01); *H01L 27/0924* (2013.01); *H01L 29/0847* (2013.01); *H01L 29/1033* (2013.01); *H01L 29/161* (2013.01); *H01L 29/66545* (2013.01); *H01L 27/092* (2013.01)

(58) Field of Classification Search
CPC ..... H01L 21/823821; H01L 21/823828; H01L 27/0924; H01L 29/0847; H01L 29/1033; H01L 29/161; H01L 29/66545; H01L 27/092

See application file for complete search history.

(56) References Cited

U.S. PATENT DOCUMENTS

2013/0270512 A1* 10/2013 Radosavljevic .......................... H01L 21/823821 257/9
2014/0175515 A1 6/2014 Then et al.
2014/0209855 A1 7/2014 Cea et al.
2018/0138289 A1* 5/2018 Rachmady ........ H01L 29/66545

OTHER PUBLICATIONS

International Preliminary Search Report for International Patent Application No. PCT/US2015/051979, dated Apr. 5, 2018, 10 pages.

* cited by examiner

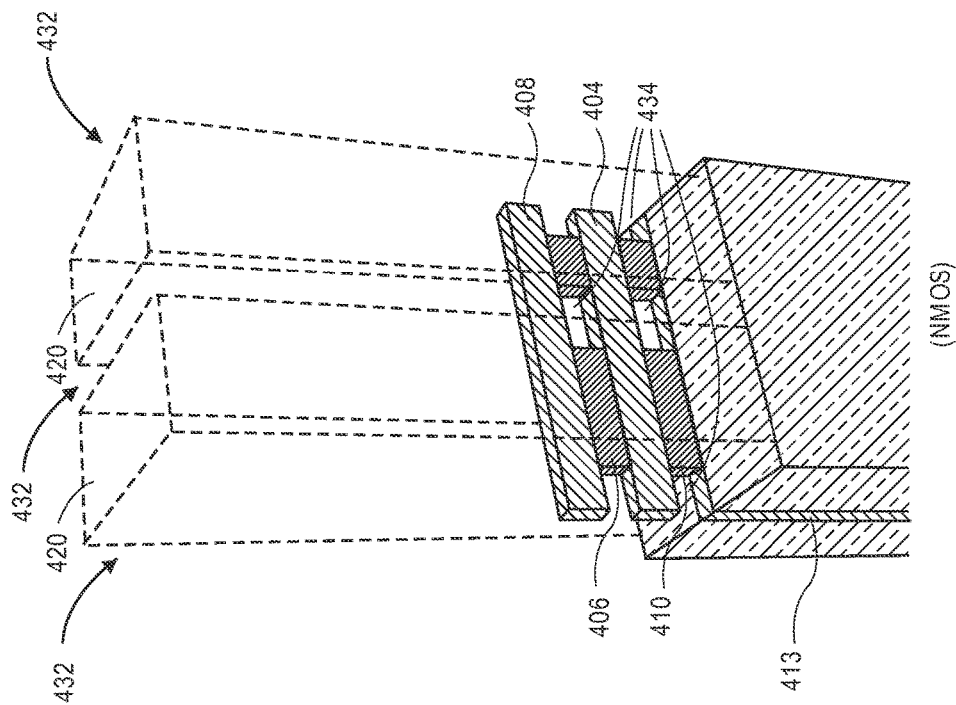
FIG. 4F (NMOS)
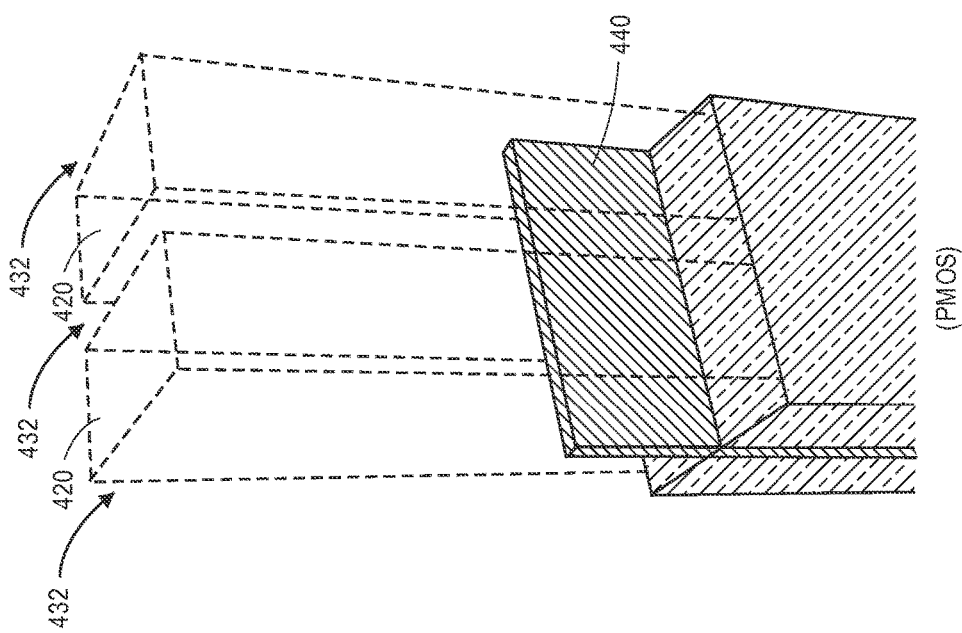
FIG. 4E (PMOS)

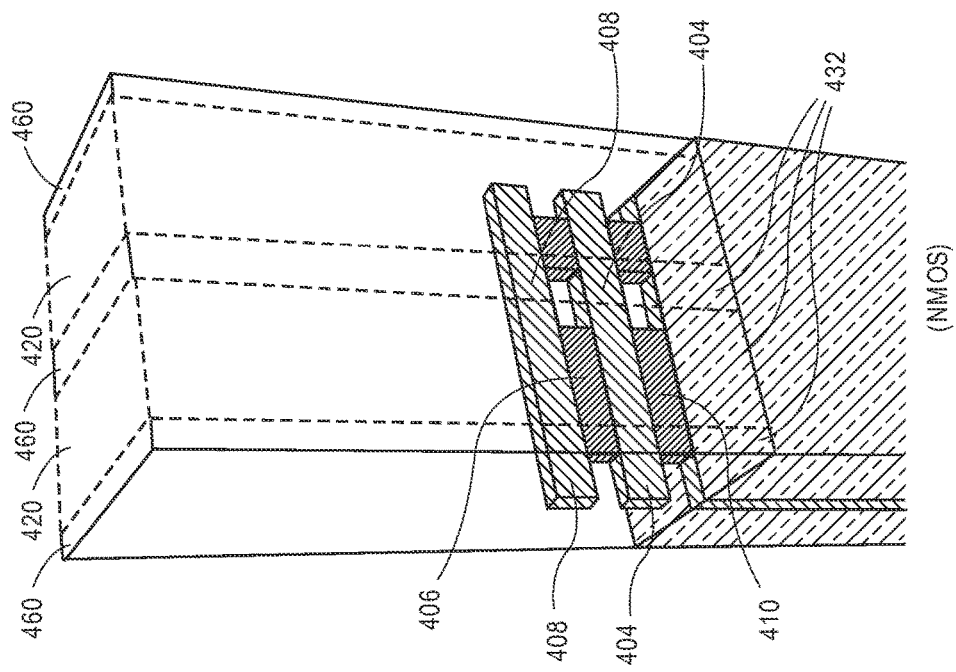
FIG. 4H (NMOS)
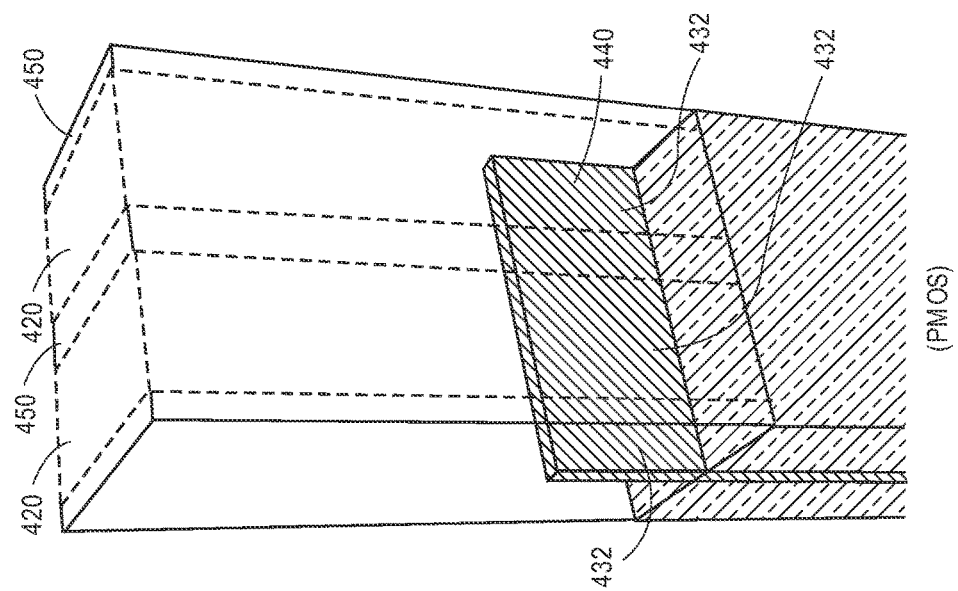
FIG. 4G (PMOS)

HYBRID TRIGATE AND NANOWIRE CMOS DEVICE ARCHITECTURE

CROSS-REFERENCE TO RELATED APPLICATION

This patent application is a U.S. National Phase Application under 35 U.S.C. § 371 of International Application No. PCT/US2015/051979, filed Sep. 24, 2015, entitled "HYBRID TRIGATE AND NANOWIRE CMOS DEVICE ARCHITECTURE," which designates the United States of America, the entire disclosure of which is hereby incorporated by reference in its entirety and for all purposes.

TECHNICAL FIELD

Embodiments of the invention are in the field of semiconductor devices and, in particular, hybrid trigate and nanowire CMOS device architecture and methods of fabricating hybrid trigate and nanowire CMOS device architecture.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, or gate-all-around devices, such as nanowires, have become more prevalent as device dimensions continue to scale down. Many different techniques have been attempted to reduce parasitic capacitance of such transistors. However, significant improvements are still needed in the area of parasitic capacitance suppression. Also, many different techniques have been attempted to manufacture devices with non-Si channel materials such as SiGe, Ge, and III-V materials. However, significant process improvements are still needed to integrate these materials onto Si wafers.

BRIEF DESCRIPTION OF THE DRAWINGS

FIG. 2C' illustrates a cross-sectional spacer view of another embodiment of the nanowire-based semiconductor structure of FIG. 2A, as taken along the b-b' axis, in accordance with an embodiment of the present invention.

FIGS. 4A-4H illustrate three-dimensional cross-sectional views representing various operations in a method of fabricating complementary semiconductor nanowire and fin structures, in accordance with an embodiment of the present invention, where:

FIG. 4A illustrates a starting structure including a fin formed above a semiconductor substrate, the starting structure common to both NMOS and PMOS devices;

FIG. 4B illustrates the structure of FIG. 4A following sacrificial gate stack material deposition and gate patterning;

FIG. 4C illustrates the structure of FIG. 2B following fabrication of source and drain structures and formation of an interlayer dielectric layer between the three sacrificial gates;

FIG. 4D illustrates the structure of FIG. 4C following removal of the three sacrificial gates;

FIG. 4E illustrates, for a PMOS device, the structure of FIG. 4D following formation of a homogeneous semiconductor fin;

FIG. 4F illustrates, for an NMOS device, the structure of FIG. 4D following removal of the portions of the first and second sacrificial release layers exposed in the channel regions of the protruding portion of the fin;

FIG. 4G illustrates, for PMOS, the structure of FIG. 4E following formation of a permanent gate stack on the portions of the fin in the channel regions; and FIG. 4H illustrates, for NMOS, the structure of FIG. 4F following formation of a permanent gate stack on the portions of the active wire-forming layers and in the channel regions.

DESCRIPTION OF THE EMBODIMENTS

Figure 1:
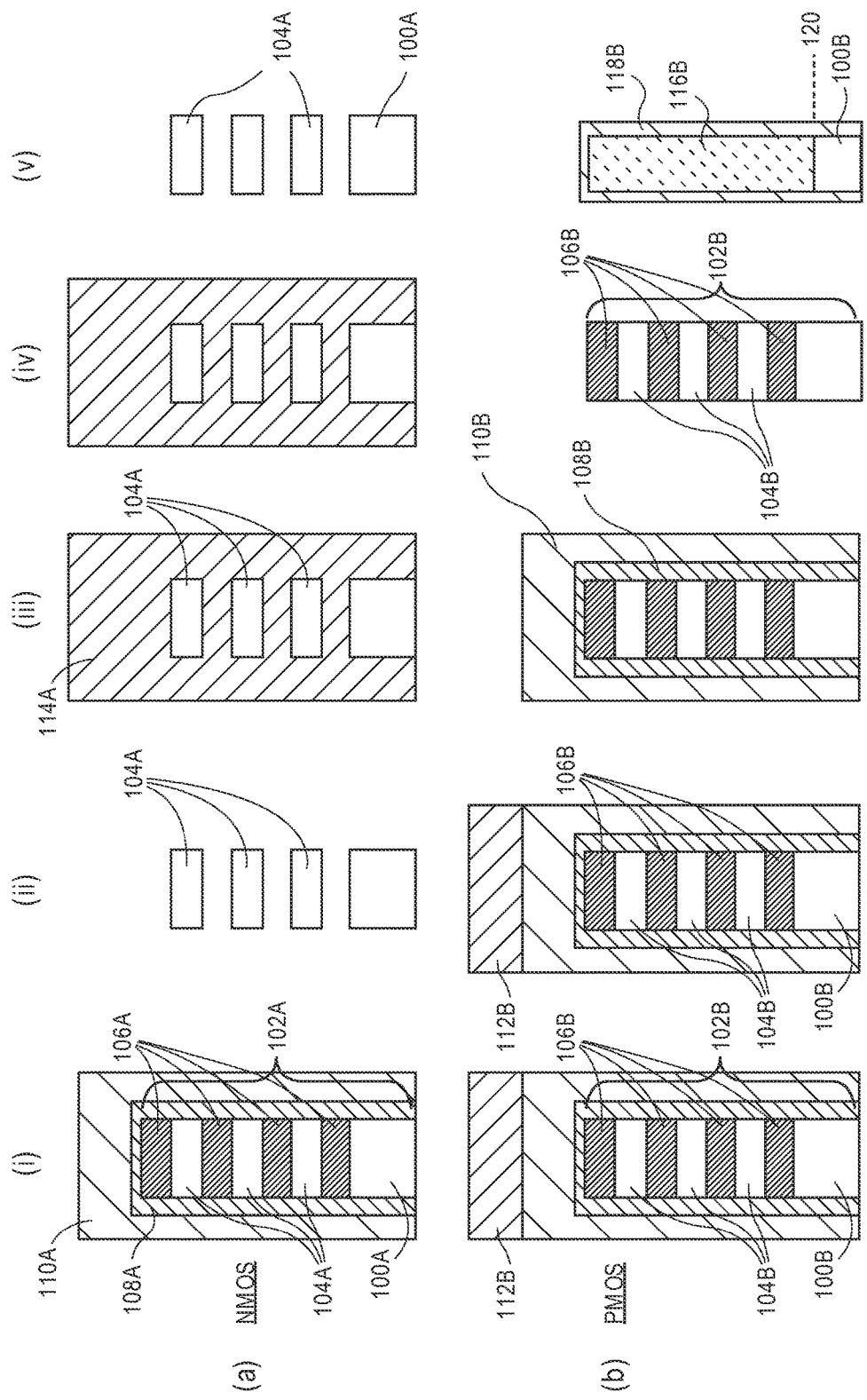
FIG. 1 illustrates a generalized processing scheme showing an NMOS nanowire fabrication pathway (a) in comparison to a PMOS TriGate fabrication pathway (b), both of which are performed on a common substrate, in accordance with an embodiment of the present invention.

Hybrid trigate and nanowire CMOS device architecture, and methods of fabricating hybrid trigate and nanowire CMOS device architecture, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

One or more embodiments described herein are directed to nanowire-based MOS (metal oxide semiconductor) field effect transistors (FETs) and frigate or fin-based MOS FETs. Particular embodiments are directed to differentiated CMOS architectures including both nanowire-based MOS FETs and trigate or fin-based MOS FETs.

To provide context, embodiments herein may address issues associated with mobility and drive current degradation for both NMOS and PMOS devices as devices scale in multi-gate silicon technology. One previous solution includes fabrication of a single device architecture (e.g., tri-gate) on a single wafer orientation. Such an approach provides optimal drive current for one device (e.g., PMOS tri-gate), but degraded drive current for the complementary device (e.g., NMOS tri-gate). Another previous solution includes fabrication of a hybrid orientation technology, where one wafer is provided with two different crystal orientations. However, such an approach may be associated with defect issues and likely requires buffer zones which consume additional die area. A third previous solution has involved the use of stress to overcome drive current degradation from orientation. However, such an approach is proving difficult to implement at scaled device geometries, as there may not be sufficient space for source/drain stressors.

In accordance with one or more embodiments described herein, and addressing one or more of the issues outlined above, an NMOS device in a CMOS architecture has a nanowire (NW) device architecture, while the PMOS device in the CMOS architecture has a tri-gate (TG) device architecture. In one such embodiment, PMOS TG devices or finFET devices are fabricated together with NMOS NW or nanoribbon (NR) devices on a (100)-oriented silicon wafer. The (100) global orientation can be optimal for both PMOS TG device drive current and NMOS NW drive current. In certain embodiments, improved drive current is achieved relative to a single wafer orientation and single device type option. Additionally, smaller die area may be used relative to the hybrid orientation option. Furthermore, large sources of stress may not be required (although it is to be appreciated that they still may be included).

Thus, as is described in greater detail below in association with FIGS. 1, 2A, 2B, 3A-3C and 4A-4H, embodiments described herein include the combination of an NMOS device based on a NW device architecture and a PMOS device based on a TG (or fin) architecture on a commonly oriented substrate. It is to be appreciated that for state of the art implementations, both NMOS and PMOS devices are normally either NW architecture or TG architecture, and not a combination of the two.

In an exemplary implementation of concepts described herein, FIG. 1 illustrates a generalized processing scheme showing an NMOS nanowire fabrication pathway (a) in comparison to a PMOS TG fabrication pathway (b), both of which are performed on a common substrate, in accordance with an embodiment of the present invention. As an overview, in accordance with an embodiment of the present invention, both NMOS and PMOS devices are fabricated in a single process flow based on a state of the art replacement gate nanowire process. In one exemplary such process, a sacrificial silicon germanium semiconductor layer is used to separate individual silicon nanowires to provide starting fin structures that can be used for the hybrid CMOS device fabrication process described below. With reference to FIG. 1, it is to be appreciated that the views shown are cross-sectional views shown in the channel regions of the corresponding NMOS and PMOS fabrication flows. It is also to be appreciated that exemplary materials are described for illustrative purposes, but are not so limited. For example, other suitable combinations of alternating semiconductor layers may be used to form fins that may undergo the processing scheme of FIG. 1, such as materials selected from various combinations of silicon, germanium, silicon germanium, or a Group III-V material. It is also to be appreciated that the NMOS and PMOS process flows may be swapped for the complementary device type in some embodiments.

Referring to operation (i) of FIG. 1, both NMOS (pathway (a)) and PMOS (pathway (b)) processing begin with fabrication of a fin 102A or 102B of alternating silicon layers 104A or 104B and silicon germanium layers 106A or 106B formed on a silicon substrate 100A or 100B, respectively. A dummy dielectric layer 108A or 108B and dummy gate electrode (such as a polycrystalline silicon dummy gate electrode) 110A or 110B are formed on the fin 102A or 102B, respectively. A mask layer 112B is formed on the stack in the PMOS pathway, but not in the NMOS pathway.

Referring to operation (ii) of FIG. 1, the NMOS (pathway (a)) fabrication scheme involves removal of the dummy dielectric layer 108A and dummy gate electrode 110A in the channel region. Subsequently the silicon germanium layers 106A are removed in the channel region, leaving silicon layers 104A to remain and ultimately be used as active channel regions (a process known as wireization). However, the mask 112B in the PMOS (pathway (b)) fabrication scheme blocks removal of the dummy dielectric layer 108B and dummy gate electrode 110B in the channel region and, hence, blocks removal of the silicon germanium layers 106B.

Referring to operations (iii) and (iv) of FIG. 1, the NMOS (pathway (a)) fabrication scheme involves masking the revealed silicon layers 104A with mask 114A. However, the mask 112B used earlier in the PMOS (pathway (b)) fabrication scheme is removed. Additionally, the dummy dielectric layer 108B and dummy gate electrode 110B are removed in the channel region. However, different from the NMOS processing scheme, the silicon germanium layers 106B are retained in the channel region, as depicted in pathway (b) of operation (iv) of FIG. 1.

Referring to operation (v) of FIG. 1, in pathway (a), the mask 114A is removed from the silicon layers 104A to provide nanowire channel regions for semiconductor device fabrication. As described in association with FIGS. 4A-4H below, further processing formation can involve gate electrode fabrication around the nanowires 104A in the channel region of the NMOS devices. In pathway (b), the fin 102B is subjected to an annealing process which leads to germanium diffusion from silicon germanium layers 106B into silicon layer 104B. In one embodiment, a uniform silicon germanium fin 116B results, as is depicted in pathway (b) of operation (v) of FIG. 1. In an embodiment, the annealing process is an oxidizing process which forms an oxide layer 118B and which thins fin 116B relative to fin 102B, as is also depicted in pathway (b) of operation (v) of FIG. 1. As described in association with FIGS. 4A-4H below, further processing formation can involve gate electrode fabrication on the fin 116B in the channel region of the PMOS devices (which may be performed subsequent to removal of oxide layer 118B, if formed).

In an embodiment, upon subjecting the fin 102B to the annealing process, the uniform silicon germanium fin 116B is an essentially homogeneous silicon germanium semiconductor fin. That is, the effect of mixing the silicon germanium and silicon layers is performed to an extent that at least electrically, the fin acts as a single semiconductor material. The actual mixing on the atomic level may not be perfectly intermixed; however, in some embodiments, perfect intermixing is achieved (e.g., where a precisely homogeneous silicon germanium semiconductor fin is formed). It is to be appreciated that the number of silicon layers relative to the number of silicon germanium layers, along with the starting germanium composition of the silicon germanium layers, can be tailored to target a certain germanium composition in the final homogeneous silicon germanium fin.

Thus, with reference again to pathway (b) of operation (v) of FIG. 1, a method of PMOS device fabrication includes mixing the portions of alternating first semiconductor layers and second semiconductor layers in the channel region to form a homogeneous semiconductor fin in the channel region. In one embodiment, mixing the portions of the alternating first semiconductor layers and second semiconductor layers includes annealing the alternating first semiconductor layers and second semiconductor layers. In one embodiment, mixing the portions of the alternating first semiconductor layers and second semiconductor layers includes oxidizing the portions of the alternating first semiconductor layers and second semiconductor layers in the channel region. In a specific such embodiment, oxidizing the portions of the alternating first semiconductor layers and second semiconductor layers in the channel region includes forming an oxide layer on the fin structure in the channel region, and the method further includes, prior to forming the permanent gate electrode stack, removing the oxide layer.

Referring again to pathway (b) of operation (v) of FIG. 1, the active device may be confined to a level above level 120. For example, in an embodiment, a shallow-trench isolation structure is formed adjacent substrate 102B portion at approximately the level 120, and gate formation is confined to the portions of the fin above level 120.

Figure 2A:
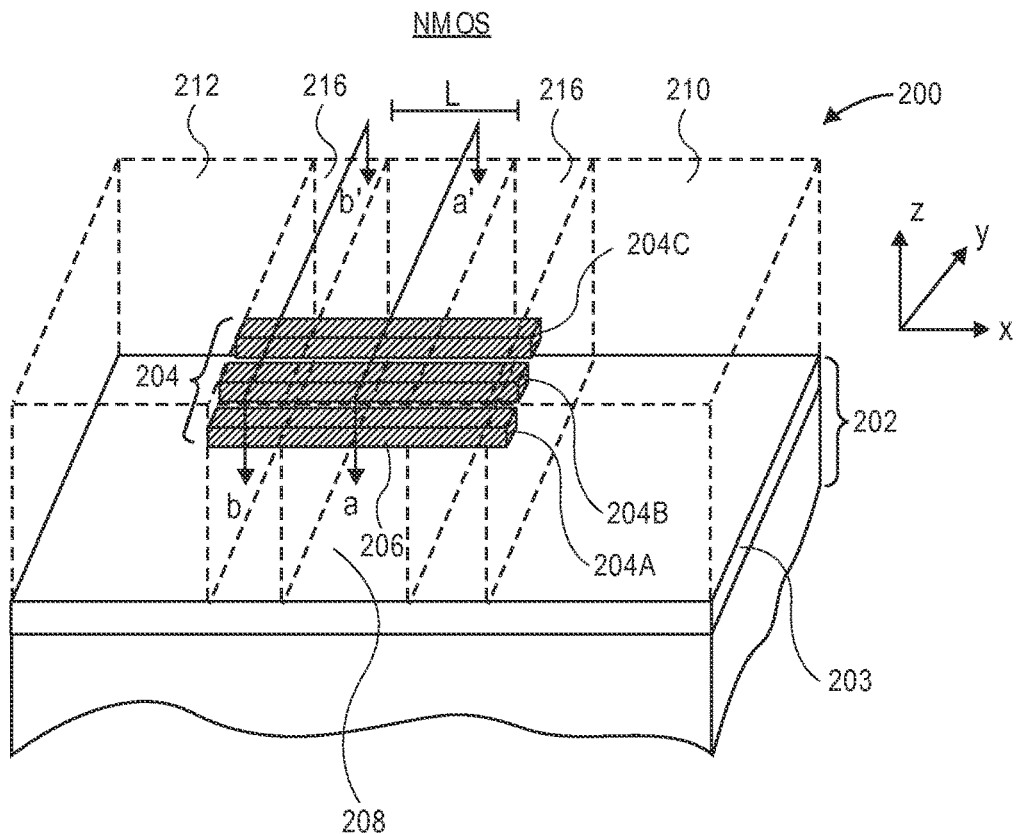
FIG. 2A illustrates a three-dimensional cross-sectional view of an NMOS nanowire-based semiconductor structure, in accordance with an embodiment of the present invention.
Figure 2B:
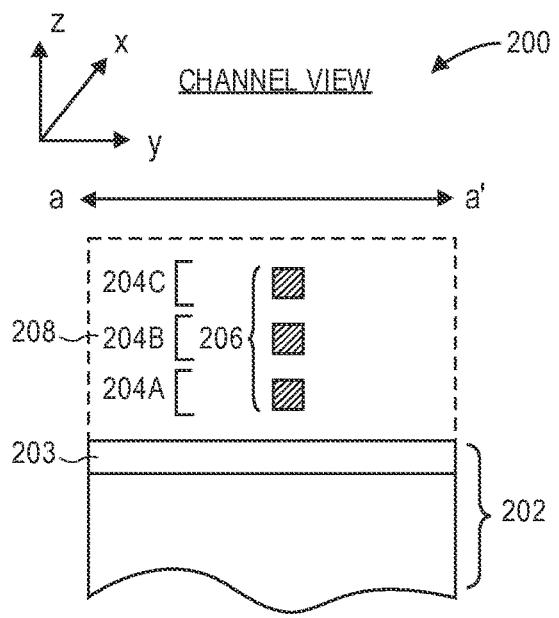
FIG. 2B illustrates a cross-sectional channel view of the nanowire-based semiconductor structure of FIG. 2A, as taken along the a-a' axis, in accordance with an embodiment of the present invention.
Figure 2C:
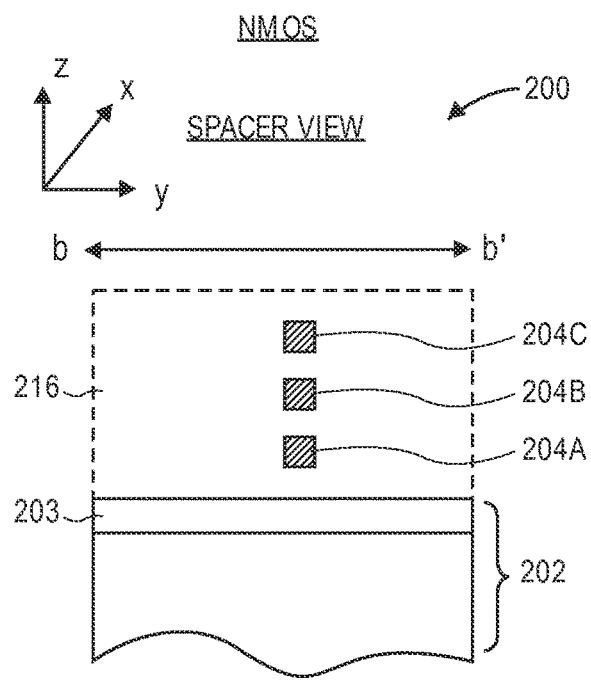
FIG. 2C illustrates a cross-sectional spacer view of the nanowire-based semiconductor structure of FIG. 2A, as taken along the b-b' axis, in accordance with an embodiment of the present invention.
Figure 2C:
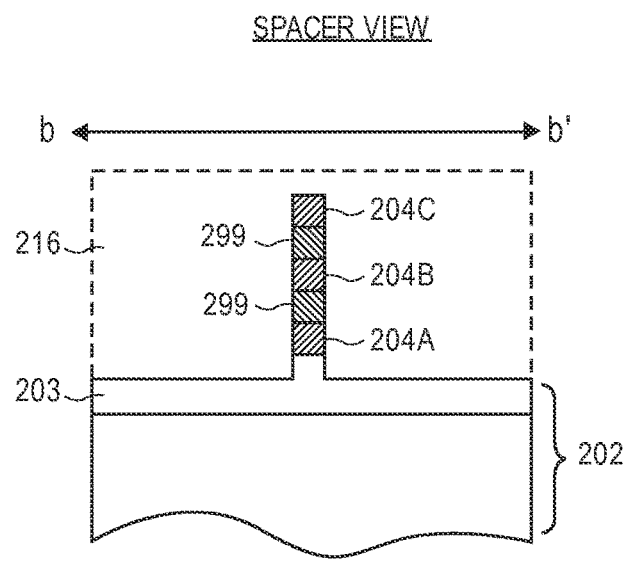

As an example of some of the structural ramifications of implementing fabrication approaches described herein, FIG. 2A illustrates a three-dimensional cross-sectional view of an NMOS nanowire-based semiconductor structure, in accordance with an embodiment of the present invention. FIG. 2B illustrates a cross-sectional channel view of the nanowire-based semiconductor structure of FIG. 2A, as taken along the a-a' axis, in accordance with an embodiment of the present invention. FIG. 2C illustrates a cross-sectional spacer view of the nanowire-based semiconductor structure of FIG. 2A, as taken along the b-b' axis, in accordance with an embodiment of the present invention. FIG. 2C' illustrates a cross-sectional spacer view of another embodiment of the nanowire-based semiconductor structure of FIG. 2A, as taken along the b-b' axis, in accordance with an embodiment of the present invention.

Referring to FIG. 2A, an NMOS semiconductor device 200 includes one or more vertically stacked nanowires (204 set) disposed above a substrate 202. Embodiments herein are targeted at both single wire devices and multiple wire devices. As an example, a three nanowire-based NMOS device having nanowires 204A, 204B and 204C is shown for illustrative purposes. For convenience of description, nanowire 204A is used as an example where description is focused on only one of the nanowires. It is to be appreciated that where attributes of one nanowire are described, embodiments based on a plurality of nanowires may have the same attributes for each of the nanowires.

Referring to both FIGS. 2A and 2B, each of the nanowires 204 (e.g., as 204A, 204B and 204C) includes a channel region 206 disposed in the nanowire. The channel region 206 has a length (L). A gate electrode stack 208 surrounds the entire perimeter of each of the channel regions 206. The gate electrode stack 208 includes a gate electrode along with a gate dielectric layer disposed between the channel region 206 and the gate electrode (distinct gate electrode and gate dielectric layer not shown here, but are described in greater detail below). The channel region 206 is discrete in that it is completely surrounded by the gate electrode stack 208 without any intervening material such as underlying substrate material or overlying channel fabrication materials. Accordingly, in embodiments having a plurality of nanowires 204 e.g., such as nanowires 204A, 204B and 204C), the channel regions 206 of the nanowires are also discrete relative to one another. However, it is to be appreciated, in some embodiments, the lowermost wire or wires may not be fully discrete and may have a tri-gate like architecture at the bottom portion of the wire stack.

Referring again to FIG. 2A, each of the nanowires 204 is coupled to common source and drain regions 210 and 212 disposed on either side of the channel regions 206. In an embodiment, the common source and drain regions 210 and 212 are semiconductor regions. Although not depicted, a pair of conductive contacts may be formed on the common source/drain regions 210/212. It is to be appreciated that in alternative embodiments, source and drain regions are discrete regions of nanowires. In such embodiments, source and drain contacts may be formed to surround the source and drain regions, respectively, of each of the nanowires.

Referring collectively to FIGS. 2A and 2C, in an embodiment, the semiconductor device 200 further includes a pair of spacers 216. The spacers 216 are disposed between the gate electrode stack 208 and the common source and drain regions 210 and 212. In an embodiment, each of the pair of spacers 216 is a continuous spacer, as opposed to having distinct outer and inner spacers. In one such embodiment, each spacer of the pair of spacers 216 includes a continuous material disposed along a sidewall of the gate electrode stack 208 and surrounding a discrete portion of each of the vertically stacked nanowires 204.

Referring collectively to FIGS. 2A and 2C', in another embodiment, the spacers 216 do not surround discrete portions of the nanowires 204. Instead, an intervening sacrificial material portion 299 (e.g., silicon germanium portions between silicon nanowires, consistent with the materials described in association with FIG. 1) remains after nanowire processing (e.g., in the case that removal of sacrificial material portion 299 is hindered either by etch limitations or by the nature of the processing integrations scheme used).

Figure 3A:
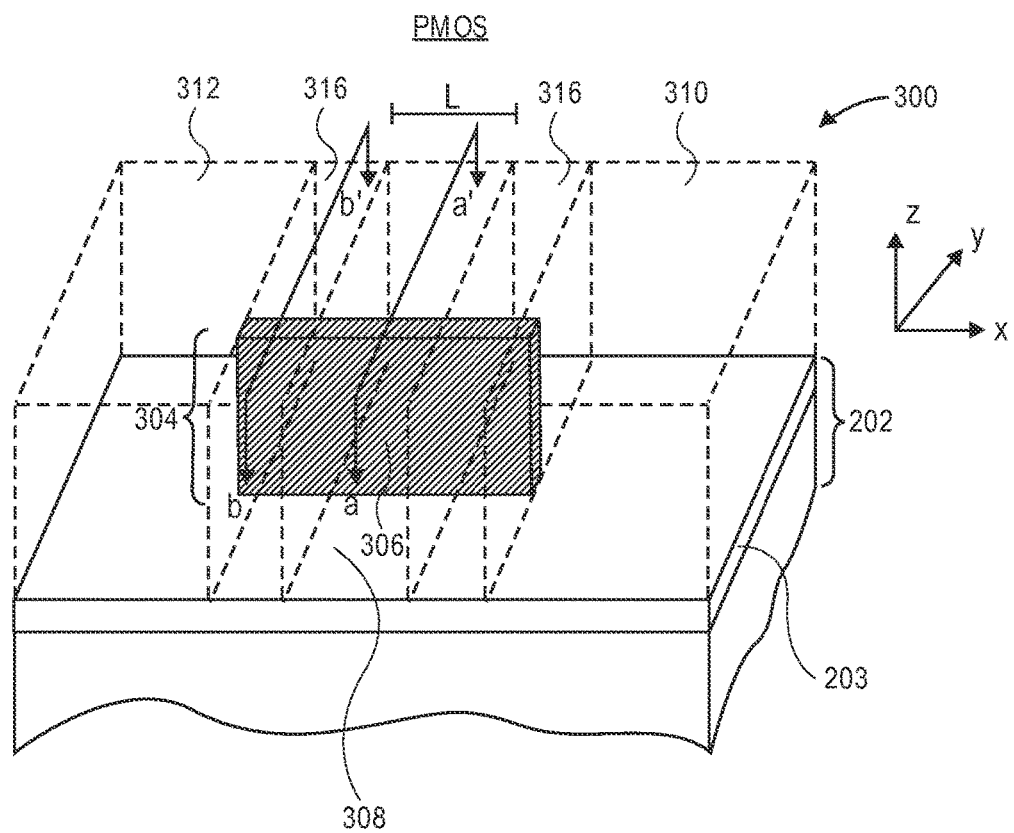
FIG. 3A illustrates a three-dimensional cross-sectional view of a PMOS fin-based semiconductor structure, in accordance with an embodiment of the present invention.
Figure 3B:
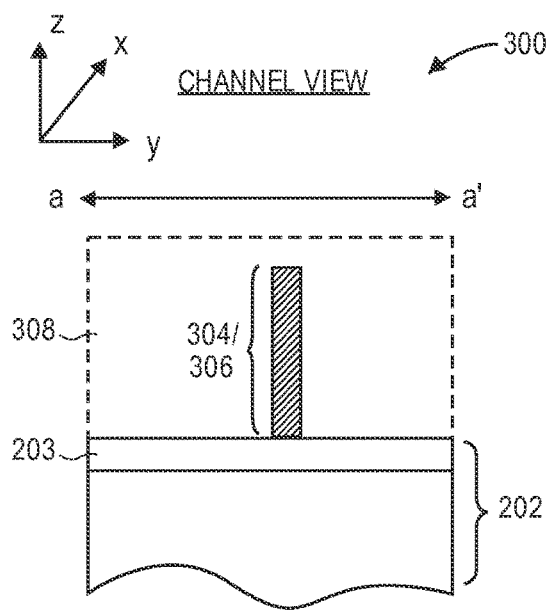
FIG. 3B illustrates a cross-sectional channel view of the fin-based semiconductor structure of FIG. 3A, as taken along the a-a' axis, in accordance with an embodiment of the present invention.

As complementary example to FIG. 2A of some of the structural ramifications of implementing fabrication approaches described herein, FIG. 3A illustrates a three-dimensional cross-sectional view of a PMOS fin-based semiconductor structure, in accordance with an embodiment of the present invention. FIG. 3B illustrates a cross-sectional channel view of the fin-based semiconductor structure of FIG. 3A, as taken along the a-a' axis, in accordance with an embodiment of the present invention.

Referring to FIGS. 3A and 3B, a PMOS semiconductor device 300 includes a fin 304 disposed above a substrate 202. The fin 304 includes a channel region 306. The channel region 306 has a length (L). A gate electrode stack 308 surrounds the entire perimeter (e.g., top and side surfaces) of the channel region 306. The gate electrode stack 308 includes a gate electrode along with a gate dielectric layer disposed between the channel region 306 and the gate electrode (distinct gate electrode and gate dielectric layer not shown here, but are described in greater detail below).

Referring again to FIG. 3A, the fin 304 is coupled to source and drain regions 310 and 312 disposed on either side of the channel region 306. In an embodiment, the source and drain regions 310 and 312 are semiconductor regions. Although not depicted, a pair of conductive contacts may be formed on the source/drain regions 310/312. Referring again to FIG. 3A, in an embodiment, the semiconductor device 300 further includes a pair of spacers 316. The spacers 316 are disposed between the gate electrode stack 308 and the source and drain regions 310 and 312.

Refer to both FIGS. 2A and 3A, substrate 202 may be composed of a material suitable for semiconductor device fabrication. In one embodiment, substrate 202 includes a lower bulk substrate composed of a single crystal of a material which may include, but is not limited to, silicon, germanium, silicon-germanium or a Group III-V compound semiconductor material. In an embodiment, an upper insulator layer 203 composed of a material which may include, but is not limited to, silicon dioxide, silicon nitride or silicon oxy-nitride is disposed on the lower bulk substrate. Thus, the structures 200 and 300 may be fabricated from a starting semiconductor-on-insulator substrate. Alternatively, the structures 200 and 300 are formed directly from a bulk substrate and local oxidation is used to form electrically insulative portions in place of the above described upper insulator layer. In another alternative embodiment, the structures 200 and 300 are formed directly from a bulk substrate and doping may be used to form electrically isolated active regions, such as nanowires and fins, respectively, thereon.

As will be appreciated for a typical integrated circuit, both N- and P-channel transistors may be fabricated on a single common substrate 202 to form a CMOS integrated circuit. In accordance with embodiments described herein, the NMOS devices are such as those described in association with structure 200 (i.e., nanowire-based devices) and the PMOS devices are such as those described in association with structure 300 (i.e., fin-based devices). In alternative embodiments, however, the PMOS devices are such as those described in association with structure 200 (i.e., nanowire-based devices) and the NMOS devices are such as those described in association with structure 300 (i.e., fin-based devices).

Referring to FIG. 2A, in an embodiment, the nanowires 204 may be sized as wires or ribbons and may have squared-off or rounder corners. In an embodiment, the nanowires 204 are single-crystalline. For example, for a silicon nanowire 204, a single-crystalline nanowire may be based from a (100) global orientation, e.g., with a <100> plane in the z-direction. It is to be appreciated that other orientations may also be considered. In an embodiment, the dimensions of the nanowires 204, from an end-on cross-sectional perspective, are on the nano-scale. For example, in a specific embodiment, the smallest dimension of each of the nanowires 204 is less than approximately 20 nanometers. In an embodiment, the nanowires 204 are composed of a strained material, particularly in the channel regions 206. In an embodiment, the nanowires 204A-204C are uniaxially strained nanowires. In the case of NMOS, the uniaxially strained nanowire or plurality of nanowires may be uniaxially strained with tensile strain. The width and height of each of the nanowires 204A-204C is shown as approximately the same, however, they need not be. For example, in another embodiment (not shown), the width of the nanowires 204A-204C is substantially greater than the height. In a specific embodiment, the width is approximately 2-10 times greater than the height. Nanowires with such geometry may be referred to as nanoribbons. In an alternative embodiment (also not shown), the nanoribbons are oriented vertically. That is, each of the nanowires 204A-204C has a width and a height, the width substantially less than the height.

Referring to FIG. 3A, in an embodiment, the fin 304 may have squared-off or rounder corners. In an embodiment, the fin 304 is single-crystalline. For example, a single-crystalline fin 304 may be based from a (100) global substrate orientation, e.g., with a <100> plane in the z-direction. It is to be appreciated that other orientations may also be considered. In an embodiment, the dimensions of the fin 304, from an end-on cross-sectional perspective, are on the nano-scale. For example, in a specific embodiment, the smallest dimension of each of the fin 304 is less than approximately 20 nanometers. In an embodiment, the fin 304 is composed of a strained material, particularly in the channel regions 306. In an embodiment, the fin 304 is a uniaxially strained fin. In the case of PMOS, the uniaxially strained fin may be uniaxially strained with compressive strain.

Referring again to FIGS. 2A and 3A, in an embodiment, the gate electrode of gate electrode stack 208 or 308 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire 104. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In an embodiment, the gate electrode of gate stack 208 is an N-type gate electrode while the gate electrode of gate stack 308 is a P-type gate electrode.

In an embodiment, the source and drain regions 210/212 or 310/312 are embedded source and drain regions, e.g., at least a portion of the nanowires or fin, respectively, is removed and replaced with a source/drain material region, as is depicted in FIGS. 2A and 3A. In an embodiment, the source and drain regions 210/212 or 310/312 are semiconductor regions. In one such embodiment, the semiconductor regions are epitaxially grown from the ends of the nanowires 204 (or fin 304) and/or from an exposed portion of an underlying bulk semiconductor substrate. In an embodiment, the source and drain regions 210/212 or 310/312 are composed of a material such as, but not limited to, silicon, germanium, silicon germanium, or a Group III-V material. In one embodiment, the source and drain regions 210/212 or 310/312 are doped with impurity atoms. In an embodiment, the source and drain regions 210/212 or 310/312 are composed of a material different from the channel material (e.g., different from the material of nanowires 204 or fin 304).

Referring again to FIGS. 2A and 3A, in an embodiment, the spacers 216 or 316 are composed of an insulative dielectric material such as, but not limited to, silicon dioxide, silicon oxy-nitride or silicon nitride. Overlying source/drain contacts (not shown) are, in an embodiment, fabricated from a metal species. The metal species may be a pure metal, such as nickel or cobalt, or may be an alloy such as a metal-metal alloy or a metal-semiconductor alloy (e.g., such as a silicide material).

Referring again to FIGS. 2A and 3A, it is to be appreciated that additional electrical contact and interconnect wiring may be fabricated in order to integrate devices such as 200 and 300 into an integrated circuit.

In another aspect, a sacrificial or replacement gate process may be used to access channel regions to form nanowire devices and complementary fin devices. As an example, FIGS. 4A-4H illustrate three-dimensional cross-sectional views representing various operations in a method of fabricating complementary semiconductor nanowire and fin structures, in accordance with an embodiment of the present invention.

Figure 4B:
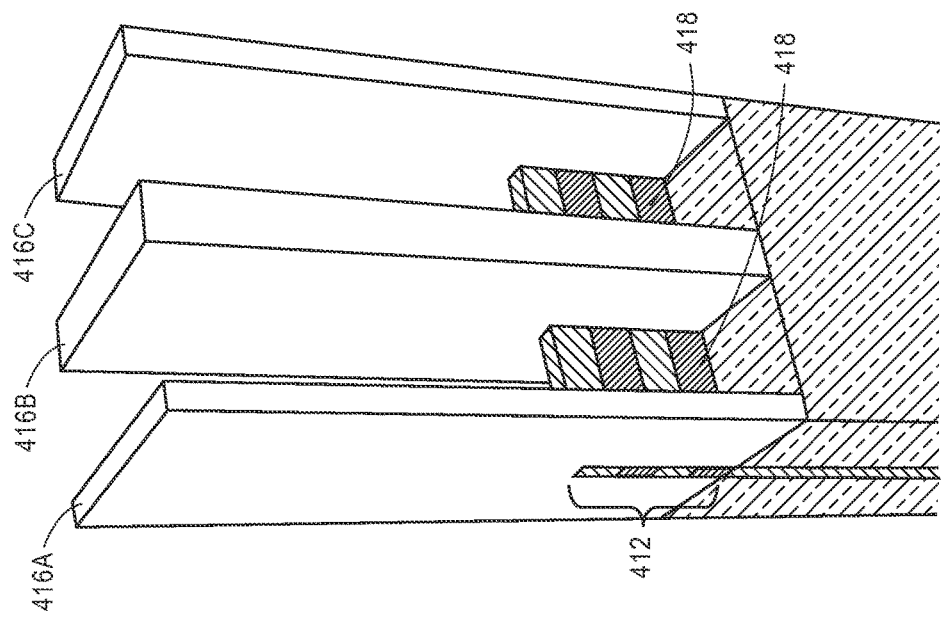
Figure 4A:
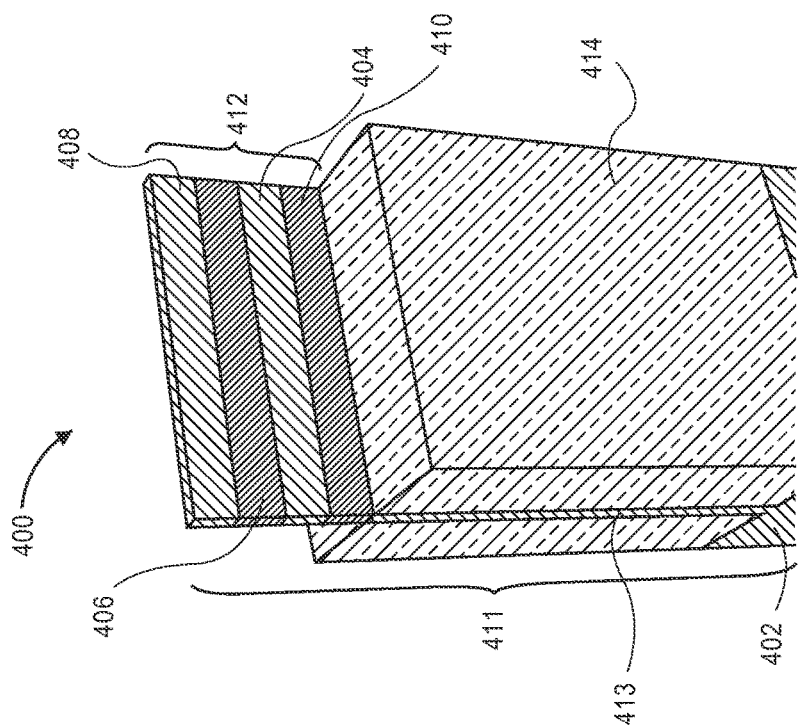

Referring to FIG. 4A, a starting structure 400 common to both NMOS and PMOS devices includes a fin 411 formed above a semiconductor substrate 402. The fin 411 includes a buried portion 413 and a protruding portion 412. The protruding portion 412 includes active wire-forming layers 404 and 408, such as silicon wire-forming layers. A first sacrificial release layer 406 (such as a first silicon germanium sacrificial release layer) is disposed between the active wire-forming layers 404 and 408. A second sacrificial release layer 410 (such as a second silicon germanium sacrificial release layer) is disposed between the active wire-forming layer 404 and the buried portion 413 of the fin 411. In an embodiment, an isolation material region 414 (such as a silicon oxide region) is formed on either side of the buried portion 413 of the fin 411, but the protruding portion 412 remains electrically coupled to the substrate 402, as is depicted in FIG. 4A. In other embodiments, however, it is to be appreciated that, in the case of fabrication of bulk devices, a subsequently formed permanent gate stack may be isolated from the semiconductor substrate 402 by a shallow trench isolation (STI) region formed after fin patterning. Alternatively, a subsequently formed permanent gate stack may be isolated from the semiconductor substrate 402 by a bottom gate isolation (BGI) structure, which may be fabricated at the time of permanent gate stack fabrication.

Referring again to FIG. 4A, in an embodiment, then, nanowires for an NMOS device can ultimately be formed by first stacking active and sacrificial materials and then etching the desired fin stack, followed by isolation material deposition, planarization and etch, and ultimate removal of the sacrificial material at least in the channel region. In the specific example described, the formation of two silicon nanowires is considered. The complementary PMOS device can ultimately be formed by annealing the active and sacrificial materials to form a homogeneous fin, as described below.

FIG. 4B illustrates the structure of FIG. 4A following sacrificial gate stack material deposition and gate patterning. In a specific example showing the formation of three gate structures, FIG. 4B illustrates the protruding portion 412 of the fin 411 with three sacrificial gates 416A, 416B, and 416C disposed thereon. In one such embodiment, the three sacrificial gates 416A, 416B, and 416C are composed of a sacrificial gate oxide layer and a sacrificial polysilicon gate layer which are, e.g., blanket deposited and patterned with a plasma etch process. It is to be appreciated that the patterning of the three sacrificial gates 416A, 416B, and 416C exposes source and drain regions 418 of the protruding portion 412 of the fin 411. It is also to be appreciated that, although not depicted, insulating spacers may be formed along the sidewalls of each of the three sacrificial gates 416A, 416B, and 416C.

Figure 4D:
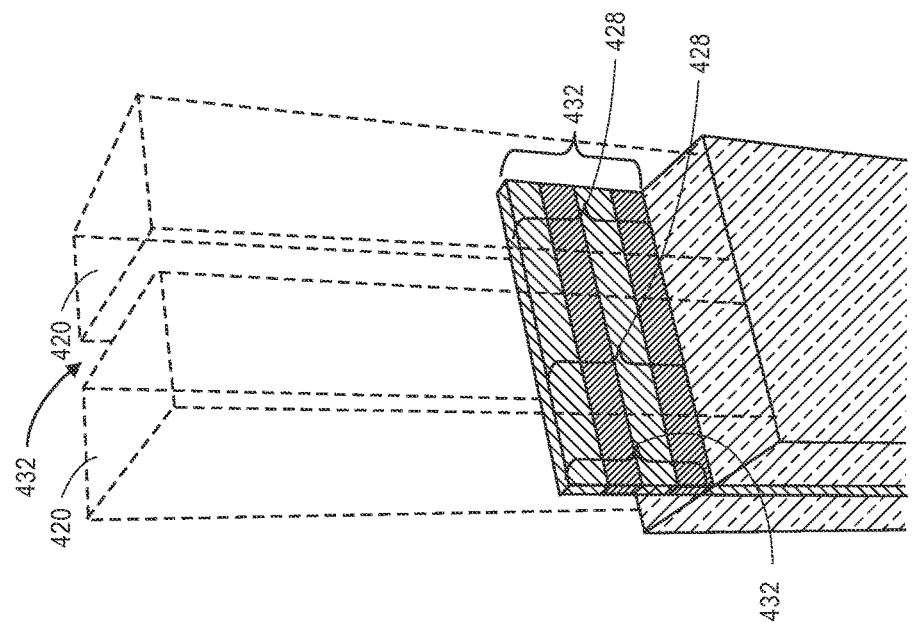
Figure 4C:
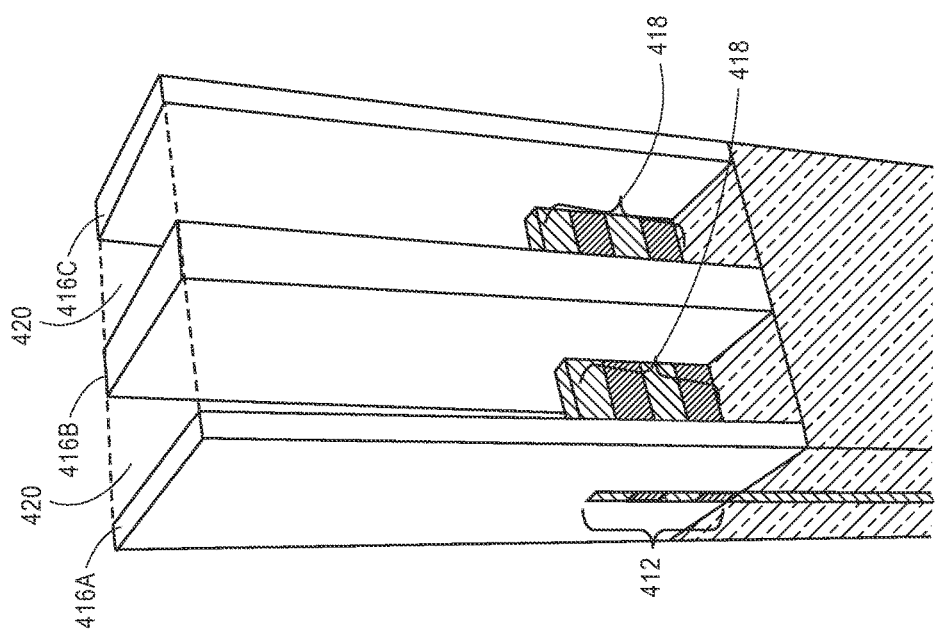

FIG. 4C illustrates the structure of FIG. 4B following fabrication of source and drain structures 428 and formation of an interlayer dielectric layer regions 420 between the three sacrificial gates 416A, 416B, and 416C. The fabrication of source and drain structures 428 can simply involve doping the regions 418 exposed by the three sacrificial gates 416A, 416B, and 416C (as depicted in FIG. 4B), can involve removal of the regions 418 and regrowth of a semiconductor material, or can involve growth of additional semiconductor material on the regions 418. In an embodiment, doping of the source and drain structures 428 may be performed either in situ or post epitaxial growth.

FIG. 4D illustrates the structure of FIG. 4C following removal of the three sacrificial gates 416A, 416B, and 416C. For example, in an embodiment, an oxide is deposited and planarized (e.g., to form interlayer dielectric layer regions 420) prior to removal of the three sacrificial gates 416A, 416B, and 416C. Such interlayer dielectric layer regions 420 cover the source and drain structures 428. Removal of the sacrificial gates 416A, 416B, and 416C is then performed without damage to adjacent structures, exposing channel regions 432.

FIG. 4E illustrates, for a PMOS device, the structure of FIG. 4D following formation of a homogeneous semiconductor fin 440. Thus, exposed fin 440 portions are provided in the channel regions 432 of the PMOS device. The formation of fin 440 can be performed as described above in association with pathway (b) of FIG. 1.

FIG. 4F illustrates, for an NMOS device, the structure of FIG. 4D following removal of the portions of the first 406 and second 410 sacrificial release layers exposed in the channel regions 432 of the protruding portion 412 of the fin 411. The removal forms spacings 434 between the active wire-forming layers 404 and 408 and between the active wire-forming layer 404 and the buried portion 413 of the fin 411.

In an embodiment, etch chemistries such as carboxylic acid/nitric acid/HF chemistry, and citric acid/nitric acid/HF, for example, may be utilized to selectively etch the portions of first and second silicon germanium sacrificial release layers (selective to silicon active wires) exposed in the channel regions 432 of the protruding portion 412 of the fin 411. Alternatively, an isotropic dry etch may be used. The resulting discrete portions of the active wire-forming layers 404 and 408 formed in the channel regions 432 will, in one embodiment, ultimately become channel regions in a nanowire-based device. Thus, at the process stage depicted in FIG. 4F, channel engineering or tuning may be performed. For example, in one embodiment, the discrete portions of the active wire-forming layers 404 and 408 shown in FIG. 4F are subsequently thinned using oxidation and etch processes.

FIG. 4G illustrates, for PMOS, the structure of FIG. 4E following formation of a permanent gate stack 450 on the portions of the fin 440 in the channel regions 432. FIG. 4H illustrates, for NMOS, the structure of FIG. 4F following formation of a permanent gate stack 460 on the portions of the active wire-forming layers 404 and 408 in the channel regions 432.

Referring to both FIGS. 4G and 4H, in an embodiment, the gate stack 450 or 460 includes a high-k gate dielectric layer, e.g., formed by atomic layer deposition (ALD). In an embodiment the gate stack 450 or 460 further includes a metal gate electrode, e.g., formed by depositing a metal (or metal-containing material) or stack of metals (or stack metal-containing materials) in the channel regions 432. It is to be appreciated that further fabrication for both the NMOS device and the PMOS device may involve formation of conductive contacts to source and drain structures 428 and/or to gate electrode stacks 450 or 460.

Figure 5:
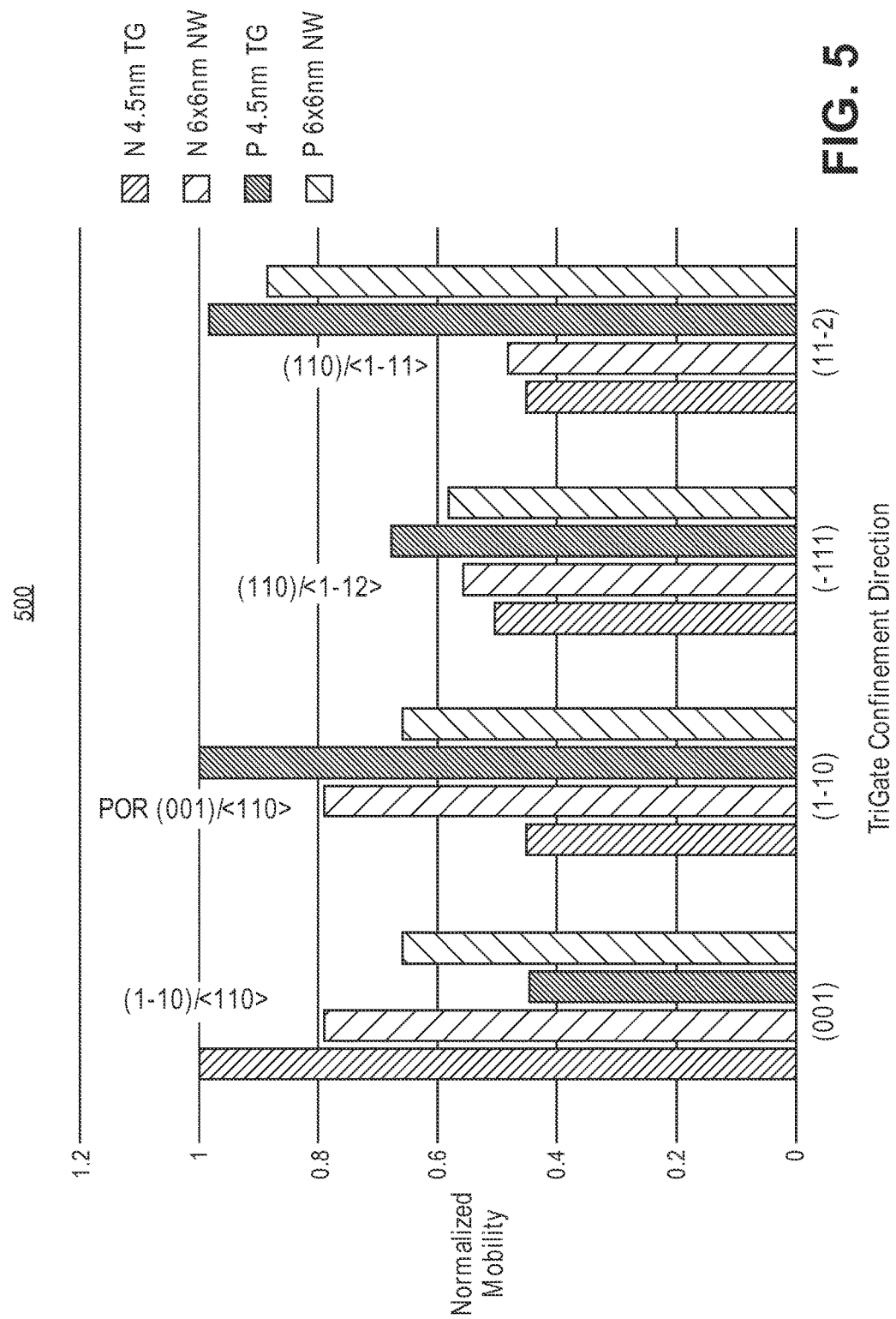
FIG. 5 is a plot for NMOS and PMOS channel mobility as a function of device architecture type, in accordance with an embodiment of the present invention.

In accordance with embodiments of the present invention, advantages of implementations described herein are evident in the plot 500 for NMOS and PMOS channel mobility shown in FIG. 5. Referring to plot 500 of FIG. 5, mobility was calculated from quantum mobility simulations using kp band structure. The bars are grouped according to the wafer surface and notch orientation, which can be read in the label above each group. As can be seen, in the case that the (001)/<110> wafer orientation is selected, the highest mobility of all possible orientations for both PMOS TG and NMOS NW are achieved. However, in the case that NMOS and PMOS TG devices are only used on a same wafer, the NMOS TG wafer achieves less than 50% of the mobility observed on the (1-10)/<110> wafer. Conversely, if one uses both NMOS and PMOS NW devices, the PMOS mobility drops more than 30% compared to PMOS TG.

Figure 6:
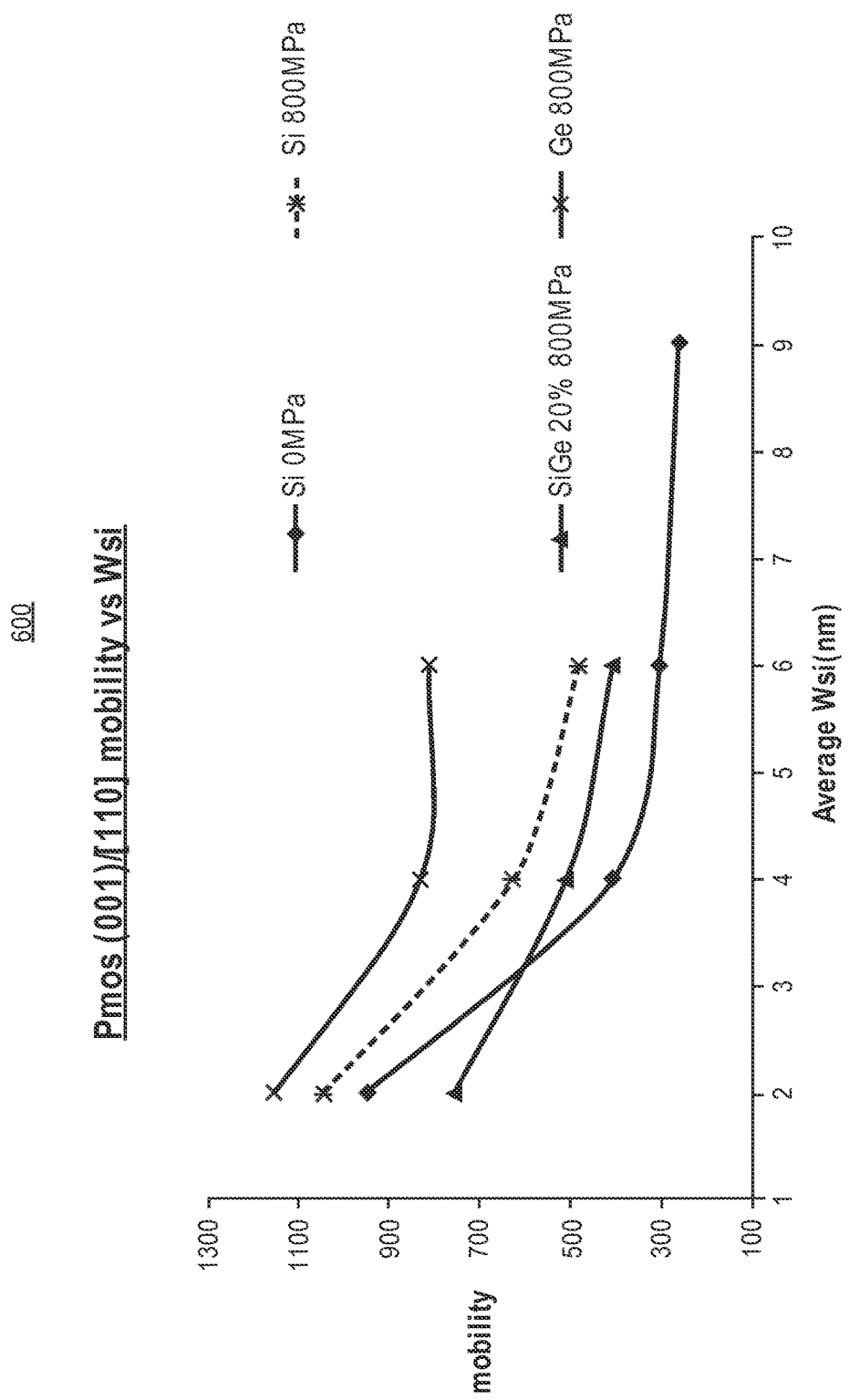
FIG. 6 is a plot of PMOS mobility as a function of fin width ($W_{Si}$), in accordance with an embodiment of the present invention.

In an embodiment, another important reason for implementing the PMOS TG architecture is that the PMOS mobility continually improves as the fin width ($W_{Si}$) is scaled. FIG. 6 is a plot 600 of PMOS mobility as a function of fin width ($W_{Si}$), in accordance with an embodiment of the present invention. Referring to plot 600 of FIG. 6, mobility simulations reveal that an increase in mobility is observed for all PMOS simulations with the (001)/[110] orientation, regardless of the applied channel stress or the substitution of Si with Ge.

Figure 7:
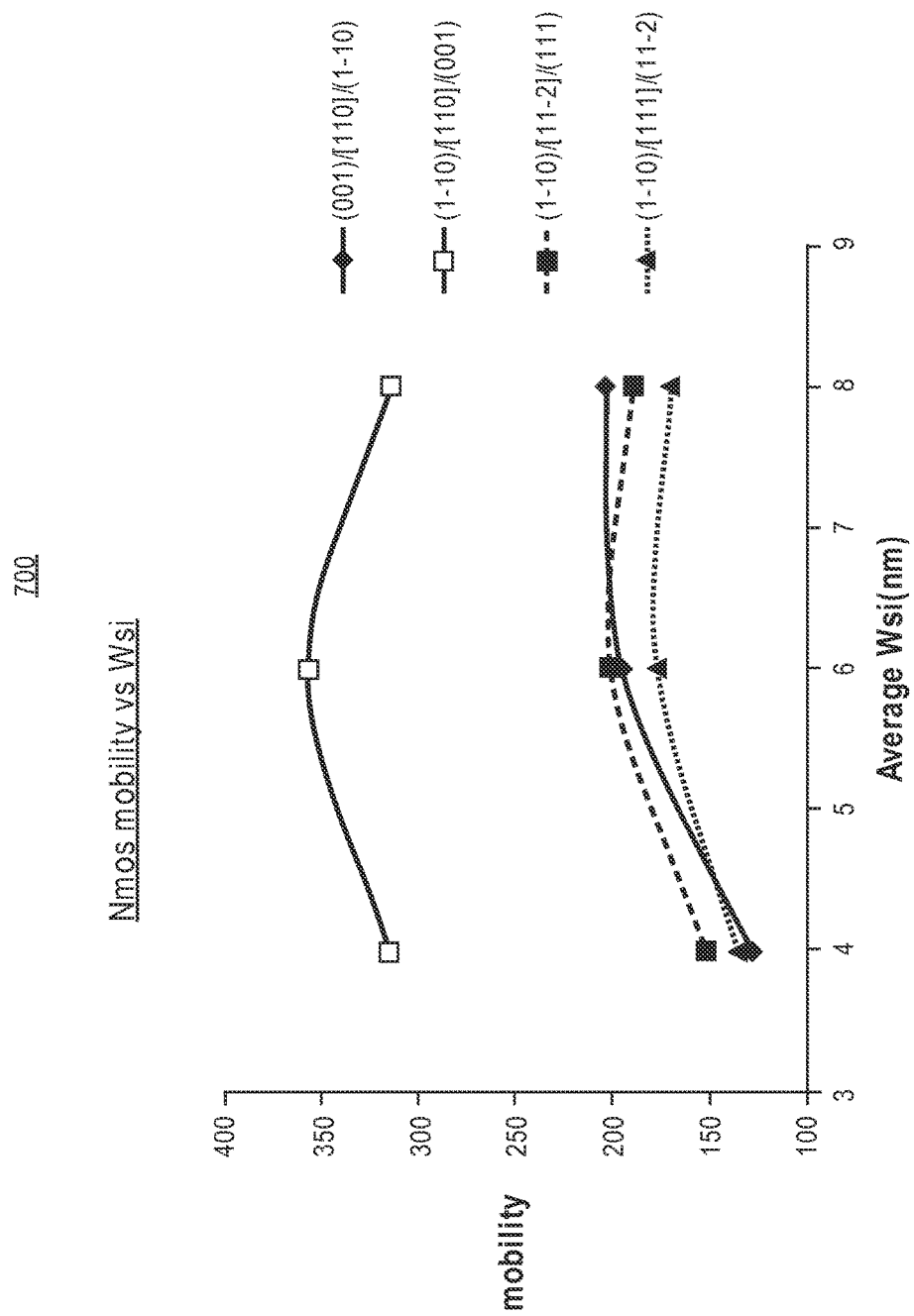
FIG. 7 is a plot of NMOS mobility as a function of fin width ($W_{Si}$), in accordance with an embodiment of the present invention.

FIG. 7 is a plot 700 of NMOS mobility as a function of fin width ($W_{Si}$), in accordance with an embodiment of the present invention. Converse to the results of plot 600, referring to plot 700 of FIG. 7, NMOS mobility degradation is observed as $W_{Si}$ scales below 6 nm, regardless of the orientation chosen. It is to be appreciated that though the above simulations show mobility, the improvements are also reflected in effective mass. Thus if charge transport in the channel approaches the ballistic limit, the advantages of the invention should still hold. Simulations show optimal NMOS NW mobility and mass and optimal PMOS TG mobility and mass for (100)/<011> silicon wafers.

Figure 8:
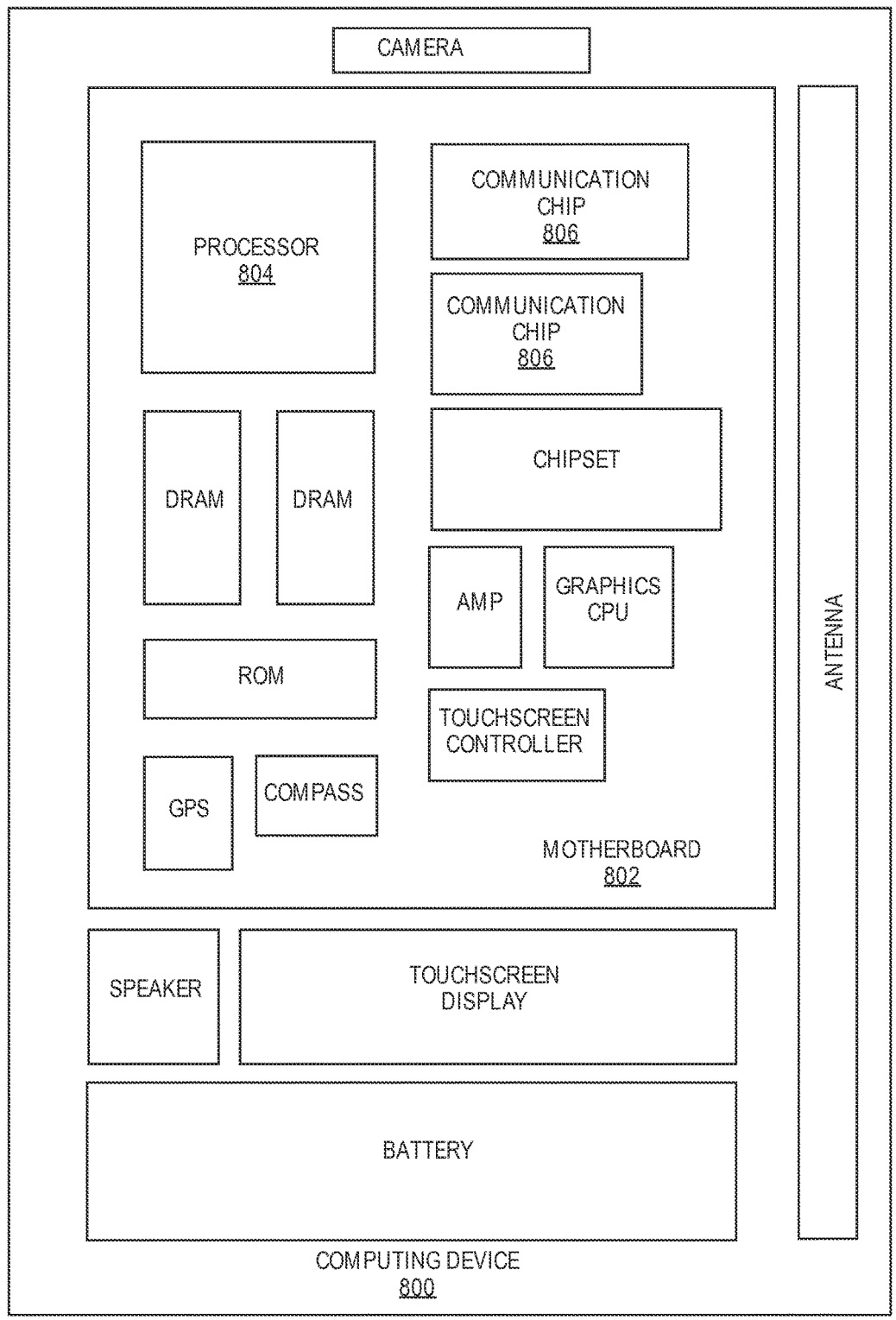
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET devices built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET devices built in accordance with implementations of the invention.

In further implementations, another component housed within the computing device 800 may contain an integrated circuit die that includes one or more devices, such as MOS-FET devices built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
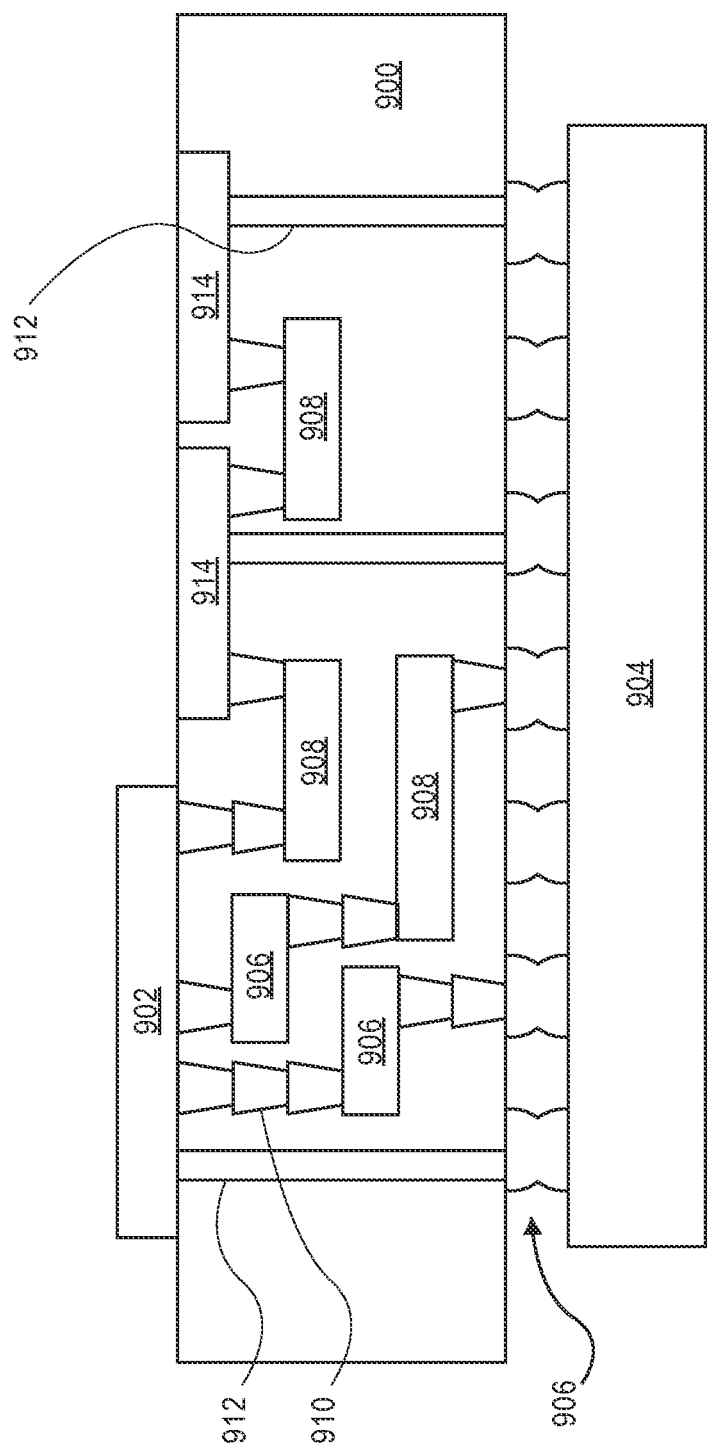
FIG. 9 is an interposer implementing one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

Thus, embodiments of the present invention include hybrid trigate and nanowire CMOS device architecture, and methods of fabricating hybrid trigate and nanowire CMOS device architecture.

In an embodiment, a semiconductor structure includes a semiconductor device of a first conductivity type. The semiconductor device of the first conductivity type includes a plurality of vertically stacked nanowires disposed above a substrate, each of the nanowires having a discrete channel region, a common gate electrode stack of the first conductivity type surrounding each of the discrete channel regions of the plurality of vertically stacked nanowires, and source and drain regions of the first conductivity type on either side of the discrete channel regions of the plurality of vertically stacked nanowires. The semiconductor structure also includes a semiconductor device of a second conductivity type opposite the first conductivity type. The second semiconductor device includes a semiconductor fin disposed above the substrate, the semiconductor fin having a channel region with a top and side surfaces, a gate electrode stack of the second conductivity type disposed on the top and side surfaces of the channel region of the semiconductor fin, and source and drain regions of the second conductivity type on either side of the channel region of the semiconductor fin.

In one embodiment, the plurality of vertically stacked nanowires is a plurality of vertically stacked nanowires of a first semiconductor material, and the semiconductor fin is a semiconductor fin of a second semiconductor material different from the first semiconductor material.

In one embodiment, the first semiconductor material is silicon, and the second semiconductor material is silicon germanium.

In one embodiment, the plurality of vertically stacked nanowires is a plurality of vertically stacked silicon nanowires.

In one embodiment, the semiconductor fin is a silicon germanium semiconductor fin.

In one embodiment, the semiconductor fin is an essentially homogeneous silicon germanium semiconductor fin.

In one embodiment, the semiconductor fin is a precisely homogeneous silicon germanium semiconductor fin.

In one embodiment, the source and drain regions of the first conductivity type are a pair source and drain region common to all of the discrete channel regions of the plurality of vertically stacked nanowires.

In one embodiment, the source and drain regions of the first conductivity type are a plurality of discrete source and drain region pairs each corresponding to a discrete channel region of one of the nanowires.

In one embodiment, the semiconductor structure further includes a first pair of dielectric spacers on either side of the common gate electrode stack of the first conductivity type, and a second pair of dielectric spacers on either side of the gate electrode stack of the second conductivity type.

In one embodiment, the common gate electrode stack of the first conductivity type includes a first high-k gate dielectric layer disposed on and surrounding each of the discrete channel regions of the plurality of vertically stacked silicon nanowires, and the gate electrode stack of the second conductivity type includes a second high-k gate dielectric layer disposed on the top and side surfaces of the channel region of the semiconductor fin.

In one embodiment, the common gate electrode stack of the first conductivity type further includes a first metal gate disposed on the first high-k gate dielectric layer, and the gate electrode stack of the second conductivity type further includes a second metal gate disposed on the second high-k gate dielectric layer.

In one embodiment, the semiconductor device of the first conductivity type is an NMOS semiconductor device, and the semiconductor device of the second conductivity type is a PMOS semiconductor device.

In an embodiment, a method of fabricating a semiconductor device includes forming a fin structure above a substrate, the fin structure including alternating first semiconductor layers and second semiconductor layers. The method also includes forming a sacrificial gate stack on the fin structure. The method also includes forming interlayer dielectric regions adjacent the sacrificial gate stack. The method also includes removing the sacrificial gate stack to expose a channel region of the fin structure. The method also includes mixing the alternating first semiconductor layers and second semiconductor layers in the channel region to form a homogeneous semiconductor fin in the channel region. The method also includes forming a permanent gate electrode stack over the homogeneous semiconductor fin in the channel region.

In one embodiment, mixing the portions of the alternating first semiconductor layers and second semiconductor layers includes annealing the alternating first semiconductor layers and second semiconductor layers.

In one embodiment, mixing the portions of the alternating first semiconductor layers and second semiconductor layers includes oxidizing the portions of the alternating first semiconductor layers and second semiconductor layers in the channel region.

In one embodiment, oxidizing the portions of the alternating first semiconductor layers and second semiconductor layers in the channel region includes forming an oxide layer on the fin structure in the channel region, and the method further includes, prior to forming the permanent gate electrode stack, removing the oxide layer.

In one embodiment, mixing the portions of the alternating first semiconductor layers and second semiconductor layers includes mixing silicon layers and silicon germanium layers.

In an embodiment, a method of fabricating a semiconductor structure includes forming a first fin structure and a second fin structure above a substrate, the first fin structure and the second fin structure fin structure each including alternating first semiconductor layers and second semiconductor layers. The method also includes forming a first sacrificial gate stack on the first fin structure and forming a second sacrificial gate stack on the second fin structure. The method also includes forming interlayer dielectric regions adjacent the first and second sacrificial gate stacks. The method also includes removing the first sacrificial gate stack to expose a channel region of the first fin structure. The method also includes removing portions of the second semiconductor layers in the channel region of the first fin structure. The method also includes removing the second sacrificial gate stack to expose a channel region of the second fin structure. The method also includes mixing the alternating first semiconductor layers and second semiconductor layers in the channel region of the second fin structure to form a homogeneous semiconductor fin in the channel region of the second of the second fin structure. The method also includes forming a first permanent gate electrode stack surrounding a discrete portion of each of the first semiconductor layers in the channel region of the first fin structure. The method also includes forming a second permanent gate electrode stack over the homogeneous semiconductor fin in the channel region of the first fin structure.

In one embodiment, removing portions of the second semiconductor layers of the first fin structure includes removing portions of silicon germanium layers selective to silicon layers using a wet etching process with a composition selected from the group consisting of an aqueous carboxylic acid/nitric acid/HF solution and an aqueous citric acid/nitric acid/HF solution.

In one embodiment, mixing the portions of the alternating first semiconductor layers and second semiconductor layers of the second fin structure includes annealing the alternating first semiconductor layers and second semiconductor layers of the second fin structure.

In one embodiment, mixing the portions of the alternating first semiconductor layers and second semiconductor layers of the second fin structure includes oxidizing the portions of the alternating first semiconductor layers and second semiconductor layers in the channel region of the second fin structure.

In one embodiment, oxidizing the portions of the alternating first semiconductor layers and second semiconductor layers in the channel region of the second fin structure includes forming an oxide layer on the second fin structure in the channel region, and the method further includes, prior to forming the second permanent gate electrode stack, removing the oxide layer.

In one embodiment, mixing the portions of the alternating first semiconductor layers and second semiconductor layers of the second fin structure includes mixing silicon layers and silicon germanium layers.

In one embodiment, the method further includes forming an NMOS device from the first fin structure, and forming a PMOS device from the second fin structure.

What is claimed is:
1. A semiconductor structure, comprising:
 a semiconductor device of a first conductivity type, comprising:
  a plurality of vertically stacked nanowires disposed above a substrate, each of the nanowires comprising a discrete channel region;
  a common gate electrode stack of the first conductivity type surrounding each of the discrete channel regions of the plurality of vertically stacked nanowires; and
  source and drain regions of the first conductivity type on either side of the discrete channel regions of the plurality of vertically stacked nanowires; and
 a semiconductor device of a second conductivity type opposite the first conductivity type, the second semiconductor device comprising:
  a semiconductor fin disposed above the substrate, the semiconductor fin having a channel region with a top and side surfaces;
  a gate electrode stack of the second conductivity type disposed on the top and side surfaces of the channel region of the semiconductor fin; and
  source and drain regions of the second conductivity type on either side of the channel region of the semiconductor fin.

2. The semiconductor structure of claim 1, wherein the plurality of vertically stacked nanowires is a plurality of vertically stacked nanowires of a first semiconductor material, and wherein the semiconductor fin is a semiconductor fin of a second semiconductor material different from the first semiconductor material.

3. The semiconductor structure of claim 2, wherein the first semiconductor material is silicon, and the second semiconductor material is silicon germanium.

4. The semiconductor structure of claim 1, wherein the plurality of vertically stacked nanowires is a plurality of vertically stacked silicon nanowires.

5. The semiconductor structure of claim 1, wherein the semiconductor fin is a silicon germanium semiconductor fin.

6. The semiconductor structure of claim 5, wherein the semiconductor fin is an essentially homogeneous silicon germanium semiconductor fin.

7. The semiconductor structure of claim 5, wherein the semiconductor fin is a precisely homogeneous silicon germanium semiconductor fin.

8. The semiconductor structure of claim 1, wherein the source and drain regions of the first conductivity type are a pair source and drain region common to all of the discrete channel regions of the plurality of vertically stacked nanowires.

9. The semiconductor structure of claim 1, wherein the source and drain regions of the first conductivity type are a plurality of discrete source and drain region pairs each corresponding to a discrete channel region of one of the nanowires.

10. The semiconductor structure of claim 1, further comprising:
 a first pair of dielectric spacers on either side of the common gate electrode stack of the first conductivity type; and
 a second pair of dielectric spacers on either side of the gate electrode stack of the second conductivity type.

11. The semiconductor structure of claim 1, wherein the common gate electrode stack of the first conductivity type comprises a first high-k gate dielectric layer disposed on and surrounding each of the discrete channel regions of the plurality of vertically stacked silicon nanowires, and the gate electrode stack of the second conductivity type comprises a second high-k gate dielectric layer disposed on the top and side surfaces of the channel region of the semiconductor fin.

12. The semiconductor structure of claim 11, wherein the common gate electrode stack of the first conductivity type further comprises a first metal gate disposed on the first high-k gate dielectric layer, and the gate electrode stack of the second conductivity type further comprises a second metal gate disposed on the second high-k gate dielectric layer.

13. The semiconductor device of claim 1, wherein the semiconductor device of the first conductivity type is an NMOS semiconductor device, and the semiconductor device of the second conductivity type is a PMOS semiconductor device.

* * * * *